United States Patent
Chooi et al.

(10) Patent No.: US 7,452,808 B2
(45) Date of Patent: Nov. 18, 2008

(54) METHOD OF COPPER/COPPER SURFACE BONDING USING A CONDUCTING POLYMER FOR APPLICATION IN IC CHIP BONDING

(75) Inventors: Simon Chooi, Singapore (SG); Yakub Aliyu, Singapore (SG); Mei Sheng Zhou, Kent Vale (SG); John Sudijono, Hillbrooks (SG); Subhash Gupta, Singapore (SG); Sudipto Roy, Spring Grove (SG); Paul Ho, Singapore (SG); Yi Xu, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 10/988,768

(22) Filed: Nov. 15, 2004

(65) Prior Publication Data

US 2005/0112799 A1    May 26, 2005

Related U.S. Application Data

(60) Division of application No. 10/076,244, filed on Feb. 13, 2002, now Pat. No. 6,821,888, which is a continuation-in-part of application No. 09/612,576, filed on Jul. 7, 2000, now abandoned.

(51) Int. Cl.
*H01L 21/44*    (2006.01)
(52) U.S. Cl. ...................................... 438/675
(58) Field of Classification Search .................. 438/674, 438/675, 108, 106, 104; 427/252
See application file for complete search history.

(56) References Cited

U.S. PATENT DOCUMENTS

| | | | |
|---|---|---|---|
| 4,042,006 A | * | 8/1977 | Engl et al. ..................... 164/46 |
| 4,685,030 A | * | 8/1987 | Reyes et al. .................. 361/783 |
| 5,441,569 A | | 8/1995 | Veligdan et al. ........ 118/723 MP |
| 5,459,098 A | | 10/1995 | Maya .......................... 437/173 |
| 5,767,009 A | | 6/1998 | Yoshida et al. .............. 438/613 |
| 5,795,818 A | | 8/1998 | Marrs .......................... 438/612 |
| 5,804,876 A | | 9/1998 | Lake et al. ................... 257/737 |

(Continued)

FOREIGN PATENT DOCUMENTS

EP    0391553 A    3/1990

(Continued)

OTHER PUBLICATIONS

The Merck Index, ninth edition, Merck and Co., Inc., Rahway, NJ, USA, 1976, p. 844, 6318 Nickel Carbonyl.

*Primary Examiner*—Davienne Monbleau
*Assistant Examiner*—Monica D Harrison
(74) *Attorney, Agent, or Firm*—Saile Ackerman LLC; Stephen B. Ackerman; Stephen G. Stanton

(57) ABSTRACT

A semiconductor chip having an exposed metal terminating pad thereover, and a separate substrate having a corresponding exposed metal bump thereover are provided. A conducting polymer plug is formed over the exposed metal terminating pad. A conforming interface layer is formed over the conducting polymer plug. The conducting polymer plug of the semiconductor chip is aligned with the corresponding metal bump. The conforming interface layer over the conducting polymer plug is mated with the corresponding metal bump. The conforming interface layer is thermally decomposed, adhering and permanently attaching the conducting polymer plug with the corresponding metal bump. Methods of forming and patterning a nickel carbonyl layer are also disclosed.

6 Claims, 3 Drawing Sheets

U.S. PATENT DOCUMENTS

| | | | |
|---|---|---|---|
| 5,891,756 A | 4/1999 | Erickson | 438/108 |
| 5,904,859 A | 5/1999 | Degani | 216/18 |
| 5,923,955 A | 7/1999 | Wong | 438/108 |
| 6,048,578 A * | 4/2000 | Milinkovic et al. | 427/252 |
| 6,177,729 B1 | 1/2001 | Benenati et al. | 257/738 |
| 6,410,415 B1 | 6/2002 | Estes et al. | 438/612 |
| 6,552,555 B1 | 4/2003 | Nuytkens et al. | 324/754 |

FOREIGN PATENT DOCUMENTS

| | | |
|---|---|---|
| GB | 428610 | 5/1935 |
| GB | 813819 | 5/1959 |
| GB | 2399815 A | 9/2004 |

\* cited by examiner

METHOD OF COPPER/COPPER SURFACE BONDING USING A CONDUCTING POLYMER FOR APPLICATION IN IC CHIP BONDING

This is a division of patent application Ser. No. 10/076,244, filing date Feb. 13, 2002, now U.S. Pat. No. 6,821,888, A Method Of Copper/Copper Surface Bonding Using A Conducting Polymer For Application In IC Chip Bonding, which is a Continuation-In-Part of patent application Ser. No. 09/612,576, filing date Jul. 7, 2000, A Method Of Copper/Copper Surface Bonding Using A Conducting Polymer For Application In IC Chip Bonding, now abandoned, assigned to the same assignee as the present invention, which are herein incorporated by reference in their entirety.

FIELD OF THE INVENTION

The present invention relates generally to the packaging of semiconductor devices, and more specifically to copper interconnect processes between chips and substrates in packaging processes.

BACKGROUND OF THE INVENTION

Recent integration of copper interconnect processes into IC (integrated circuit) manufacturing requires copper terminating chips to be bonded directly on the copper metal pad and circuit boards. The present invention allows the use of conducting polymers to bond copper terminating chips directly on copper substrate or printed circuit boards.

U.S. Pat. No. 5,923,955 to Wong describes a process for creating a flip-chip bonded combination for a first and second integrated circuits using a Ni/Cu/TiN structure.

U.S. Pat. No. 5,891,756 to Erickson describes a method for forming a solder bump pad, and specifically to converting a wire bond pad of a surface-mount IC device to a flip-chip solder bump pad such that the IC device can be flip-chip mounted to a substrate. The method uses a Ni layer over the pad.

U.S. Pat. No. 5,795,818 to Marrs describes a method of forming an interconnection between bonding pads on an integrated circuit chip and corresponding bonding contacts on a substrate. The method uses coined ball bond bumps.

U.S. Pat. No. 5,904,859 to Degani describes a method for applying under bump metallization (UBM) for solder bump interconnections on interconnection substrates. The UBM comprises a Cu, Cu/Cr, Cr multilayer structure.

U.S. Pat. No. 5,767,009 to Yoshida et al. describes a method of reducing cross talk noise between stacked semiconductor chips by the use of a chip on chip mounting structure.

U.S. Pat. No. 5,804,876 to Lake et al. describes a low contact resistance electrical bonding interconnect having a metal bond pad portion and conductive epoxy portion.

SUMMARY OF THE INVENTION

Accordingly, it is an object of the present invention is to provide a method of bonding a chip to a substrate without the need for a bump metal, wetting agents, and barrier materials.

Another object of the present invention is to provide a method of bonding a chip to a substrate avoiding the use of environmentally unfriendly solder and solder material.

An additional object of the present invention is to provide a method of bonding a chip to a substrate in smaller micron scale metal pitch sizes.

Other objects will appear hereinafter.

It has now been discovered that the above and other objects of the present invention may be accomplished in the following manner. Specifically, a semiconductor chip having an exposed metal terminating pad thereover, and a separate substrate having a corresponding exposed metal bump thereover are provided. A conducting polymer plug is formed over the exposed metal terminating pad. A conforming interface layer is formed over the conducting polymer plug. The conducting polymer plug of the semiconductor chip is aligned with the corresponding metal bump. The conforming interface layer over the conducting polymer plug is mated with the corresponding metal bump. The conforming interface layer is thermally decomposed, adhering and permanently attaching the conducting polymer plug of the semiconductor chip with the corresponding metal bump of the separate substrate. Methods of forming and patterning a nickel carbonyl layer are also disclosed.

BRIEF DESCRIPTION OF THE DRAWINGS

The features and advantages of the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

Unless otherwise specified, all structures, layers, etc. may be formed or accomplished by conventional methods known in the prior art.

Figure 1:
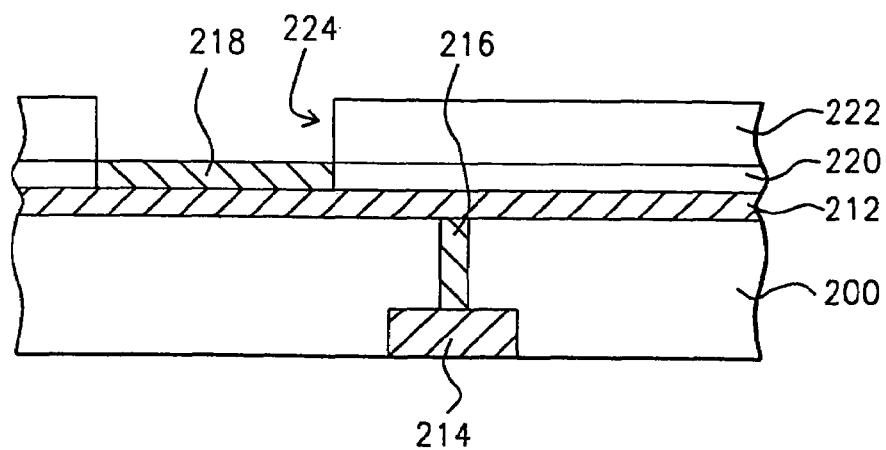
FIGS. 1 to 6 schematically illustrate in cross-sectional representation a preferred embodiment of the present invention.

Accordingly, as shown in FIG. 1, semiconductor structure 200 includes an overlying final metal layer 212 connected to, for example, metal line 214 through metal via 216. Metal terminating pad 218 overlies final metal layer 212 at a predetermined position within first passivation layer 220.

Semiconductor structure 200 is understood to possibly include a semiconductor wafer or substrate, active and passive devices formed within the wafer, conductive layers and dielectric layers (e.g., inter-poly oxide (IPO), intermetal dielectric (IMD), etc.) formed over the wafer surface. The term "semiconductor structure 200" is meant to include a semiconductor chip.

Final metal layer 212 and metal terminating pad 218 are preferably comprised of copper as will be used for illustrative purposes hereafter.

Additional metal vias 216, metal lines 214, metal terminating pads 218, etc., may be formed within and over semiconductor structure 200 although for purposes of illustration, only single such structures are shown in FIG. 11. For purposes of simplicity, metal via 216, metal line 214, and final metal layer 212 are not explicitly illustrated in the following FIGS. 2-6.

Final passivation layer 222 is formed over first passivation layer 220 and copper terminating pad 218 to a thickness of from about 1000 to 10,000 Å, and more preferably from about 2000 to 5000 Å.

Opening 224 is formed within second passivation layer 222 exposing copper terminating pad 218.

Figure 2:
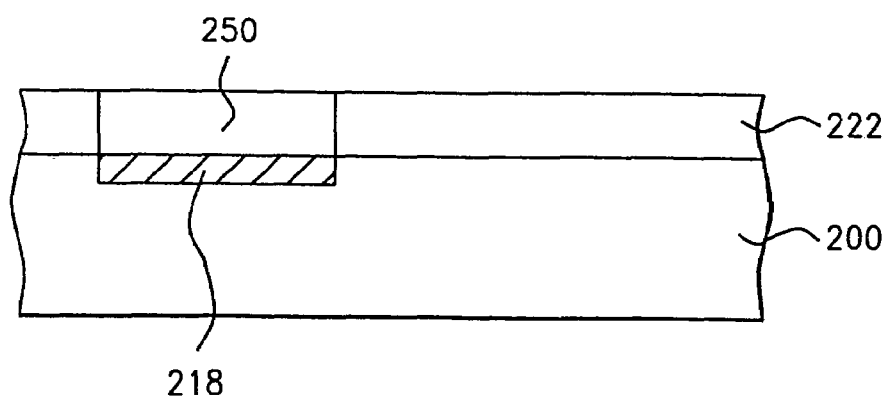

As shown in FIG. 2, planarized conducting polymer plug 250 is formed within opening 224 by flowing or using a spin-on-technique on copper surfaces such a bonding pads 218 or copper tracks on printed circuit boards. Planarized conducting polymer plug 250 is preferably from about 1000 to 10,000 Å thick, and more preferably from about 3000 to 6000 Å thick.

Conducting polymer plug 250 includes, but is not restricted to doped polyacetylene, poly (para-phenylene vinylene) (PPV), or polyaniline manufactured by DuPont, Ciba Geigy, and Sieman's and others.

Conducting polymer plug 250 is used to achieve an effective copper/copper surface bonding in copper terminating IC chip pads 218. The conducting polymer has good conductive properties, is highly doped to degeneracy (see below), has good adhesive properties and very useful thermal insulation properties.

The main characteristics of the conducting polymer forming conducting polymer plug 250 is the presence of the so-called conjugated chain where the chemical bonding between the atoms in the mainly carbon "backbone" of the polymer chain alternates between single and double bonds.

There are two types of bonds namely the omega-bond and the phi-bond. Electrons in the former (omega-bond) are strongly localized and form strong bonds, in contrast to the later (phi-bond) in which the electrons form weak bonds and are not localized.

The electrons in phi-bonds can be thought of a cloud that extends along the entire length of the conjugated chain in which electrons are free to move in a similar fashion to conducting electrons in a metal. The conducting polymer is heavily doped to achieve a conduction which is comparable to a degenerate semiconductor and is sufficient enough not to perturb the device performance.

Figure 3:
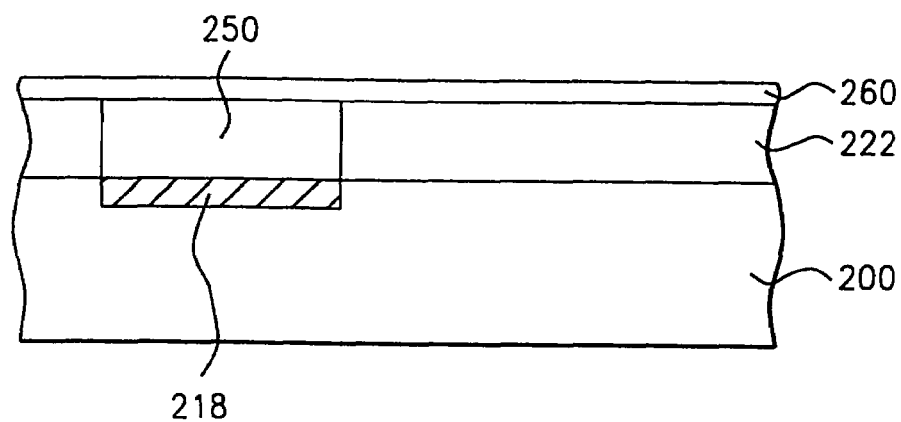

As shown in FIG. 3, interface layer 260 is formed over second passivation layer 222 and conducting polymer plug 250. Interface layer 260 is preferably comprised of nickel carbonyl ($Ni(CO)_4$) as will be used for illustrative purposes hereafter. The material for interface layer is selected to be subject to thermal decomposition be chemical combustible.

$Ni(CO)_4$ has a freezing point of −19° C., between −19° C. and 40° C. nickel carbonyl exists as a liquid and, at temperatures above 40° C., the following reaction takes place:

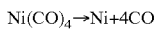

Below 40° C., the reverse reaction takes place:

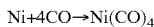

Two methods may be used to form $Ni(CO)_4$ interface layer 260. In the first method, nickel is first deposited (through sputtering or electroplating) over second passivation layer 222 and conducting polymer plug 250. Then, carbon monoxide (CO) is introduced into the reaction chamber and reacts with the deposited nickel layer to form $Ni(CO)_4$ interface layer 260. The CO may be pressurized as necessary. The temperature of the chamber and/or the temperature of the wafer must be less than 40° C. to form the $Ni(CO)_4$ and then keep below −19° C. to maintain the $Ni(CO)_4$ interface layer 260 as a solid.

In the second method, liquid $Ni(CO)_4$ (at a temperature between −19° C. and 40° C.) is flowed over second passivation layer 222 and conducting polymer plug 250 and then the temperature of the chamber and/or the temperature of the wafer is lowered to less than −19° C. so as to convert the liquid $Ni(CO)_4$ into solid $Ni(CO)_4$ interface layer 260.

Regardless of which method is used, the temperature of the chamber and/or the temperature of the wafer must be less than −19° C. to maintain the $Ni(CO)_4$ interface layer 260 as a solid.

Figure 4:
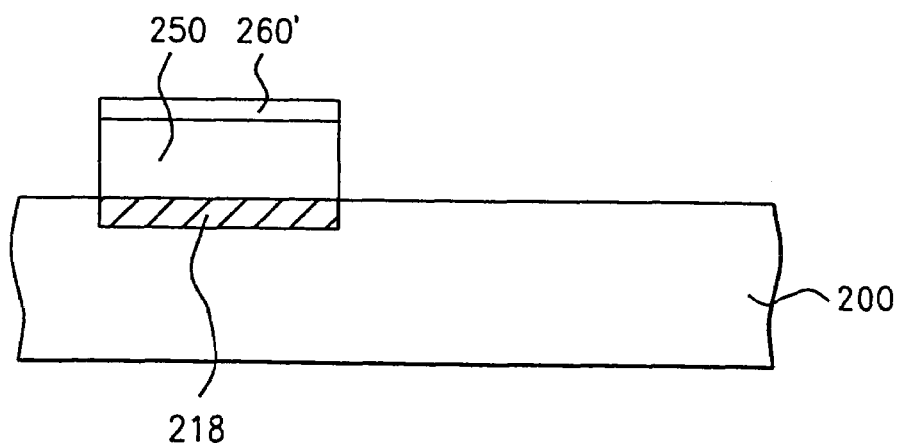

As shown in FIG. 4, the excess of $Ni(CO)_4$ interface layer 260 not over conducting polymer plug 250 is removed to form conforming $Ni(CO)_4$ interface layer 260' over conducting polymer plug 250. To remove the excess of $Ni(CO)_4$ interface layer 260 not over conducting polymer plug 250, a partial chrome photomask (not shown) is formed over the wafer with the chrome portion of the photomask overlying that portion of the $Ni(CO)_4$ interface layer 260 overlying the conducting polymer plug 250. The partial chrome photomask is then subjected to a radiation source such that radiation penetrates the photomask to the $Ni(CO)_4$ interface layer 260 not over conducting polymer plug 250 and raising the temperature of that portion of the $Ni(CO)_4$ interface layer 260 above 40° C. so that the reaction

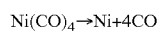

takes place, removing the $Ni(CO)_4$ interface layer 260 not over conducting polymer plug 250. No radiation may penetrate the chrome portion of the photomask overlying the $Ni(CO)_4$ interface layer 260 over conducting polymer plug 250 so that portion of the $Ni(CO)_4$ interface layer 260 remains as $Ni(CO)_4$.

Figure 5:
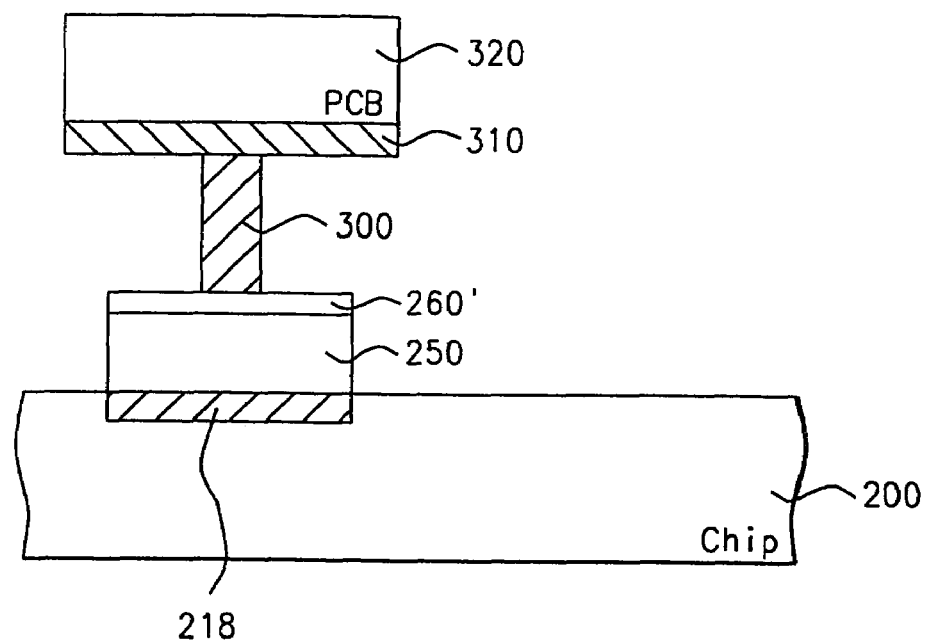

Final passivation layer 222 is also then removed, exposing conducting polymer plug 250 with overlying conforming $Ni(CO)_4$ interface layer 260'. As shown in FIG. 5, pre-formed metal bump 300 (connected to metal track 310 within substrate 320) is aligned, mechanically pressed, and mated with, conducting polymer plug 250 with overlying conforming $Ni(CO)_4$ interface layer 260'. Substrate 320 may be a bond pad or a printed circuit board, for example.

Metal bump 300 and metal track 310 are preferably comprised of copper as will be used for illustrative purposes hereafter. Cu metal bump 300 is formed by electroless plating, at about 200° C.

Figure 6:
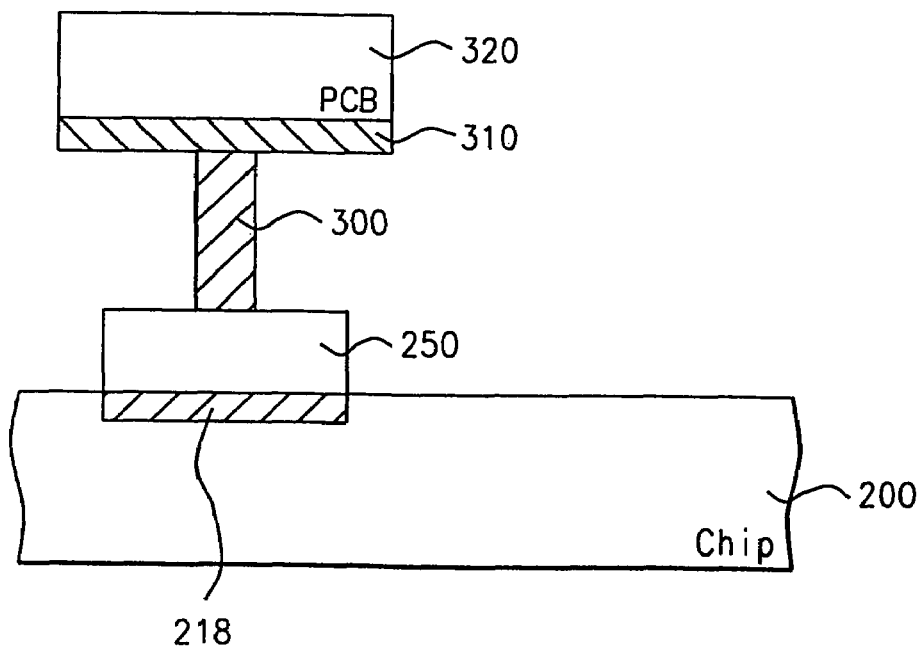

As shown in FIG. 6, conforming $Ni(CO)_4$ interface layer 260' thermally decomposes allowing copper bump 300 to adhere directly with conducting polymer plug 250 at temperature above about 40° C.:

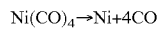

With slight application of pressure, the thermal decomposition of $Ni(CO)_4$ interface layer 260' facilitates Ni bonding of copper bump 300 to conducting poly plug 250.

The present invention may find wide application in flip-chip, chip-on-board, and micron metal bonding and provides for micron scale bonding.

Thus, the present invention permits semiconductor chips with copper interconnect termination to be directly bonded by a flip-chip, chip-on-board, and micron metal bonding processes onto a copper substrate or printed circuit board, eliminating the need for a bump metal, wetting agent metals and barrier materials with the attendant costly process steps and materials involved. It further avoids the use of environmentally unfriendly solder and solder materials, and allows for use in smaller micron scale metal pitch sizes unlike most of the current bonding techniques.

While particular embodiments of the present invention have been illustrated and described, it is not intended to limit the invention, except as defined by the following claims.

We claim:
1. A method of bonding a chip to a substrate, comprising the steps of:
providing a semiconductor chip having an exposed metal terminating pad thereover, and a separate substrate having a corresponding metal bump thereover;

forming a conducting polymer plug over said exposed metal terminating pad;

forming an interface layer of solid $Ni(CO)_4$ over said conducting polymer plug comprising the steps of providing the semiconductor chip within a reaction chamber;

forming a liquid layer of $Ni(CO)_4$ over the semiconductor chip at a temperature between $-19°$ C. and $40°$ C.; and then lowering the temperature of the semiconductor chip or the reaction chamber below $-19°$ C. to convert the liquid layer of $Ni(CO)_4$ over the substrate into a solid $Ni(CO)_4$ layer.

2. The method of claim 1, further comprising:

aligning the corresponding metal bump with the conducting polymer plug and the interface layer of $Ni(CO)_4$ overlying the conducting polymer plug; and decomposing the interface layer of $Ni(CO)_4$ thereby allowing the corresponding metal bump to adhere directly with the conducting polymer plug.

3. The method of claim 2, further comprising removing any excess interface layer of $Ni(CO)_4$ not overlying the conducting polymer plug before aligning the corresponding metal bump with the conducting polymer plug and the interface layer of $Ni(CO)_4$ overlying the conducting polymer plug.

4. The method of claim 1, wherein the metal terminating pad and the corresponding metal bump are comprised of copper.

5. The method of claim 1, wherein the conducting polymer plug is formed of a conducting polymer material that is heavily doped to achieve conductive properties.

6. The method of claim 5, wherein the conducting polymer plug is comprised of a material selected from doped polyacetylene, poly (para-phenylene vinylene) (PPV) or polyaniline.

* * * * *

UNITED STATES PATENT AND TRADEMARK OFFICE
CERTIFICATE OF CORRECTION

PATENT NO.        : 7,452,808 B2
APPLICATION NO. : 10/988768
DATED             : November 18, 2008
INVENTOR(S)       : Simon Chooi et al.

It is certified that error appears in the above-identified patent and that said Letters Patent is hereby corrected as shown below:

Title Page;
In the Inventor, (75), delete Inventor number six "Sudipto Roy" and replace with -- Sudipto Ranendra Roy --

Signed and Sealed this

Twenty-fourth Day of March, 2009

JOHN DOLL
*Acting Director of the United States Patent and Trademark Office*